United States Patent [19]

Sorensen et al.

[11] Patent Number: 4,518,738
[45] Date of Patent: May 21, 1985

[54] POWDER FOR USE IN DRY SENSITIZATION FOR ELECTROLESS PLATING

[75] Inventors: Gunnar Sorensen, Risskov; Leo Svendsen, Aarhus, both of Denmark

[73] Assignee: NESELCO, Copenhagen, Denmark

[21] Appl. No.: 387,887

[22] PCT Filed: Oct. 9, 1981

[86] PCT No.: PCT/DK81/00087

§ 371 Date: Jun. 4, 1982

§ 102(e) Date: Jun. 4, 1982

[87] PCT Pub. No.: WO82/01382

PCT Pub. Date: Apr. 29, 1982

[30] Foreign Application Priority Data

Oct. 10, 1980 [DK] Denmark .......................... 4277/80

[51] Int. Cl.³ .............................................. C08K 3/10
[52] U.S. Cl. .................................... 524/435; 524/401; 524/434; 524/784; 525/223; 427/92; 427/304; 427/437

[58] Field of Search ............... 524/401, 435, 784, 434; 427/437

[56] References Cited

U.S. PATENT DOCUMENTS 4,077,853 3/1978 Coll-Palagos .......................... 204/20
4,154,718 5/1979 Miyata et al. ........................ 524/434
4,246,368 1/1981 Murase ................................. 525/223

FOREIGN PATENT DOCUMENTS 8000023 10/1980 Denmark .

Primary Examiner—Joseph L. Schofer
Assistant Examiner—T. M. Reddick
Attorney, Agent, or Firm—Oblon, Fisher, Spivak, McClelland and Maier

[57] ABSTRACT

This invention relates to a powder for use in dry sensitization for electroless plating, the powder comprising a plastics base material which is a mixture of hydrophobic and hydrophilic plastics materials to which has been added sensitizing particles.

3 Claims, No Drawings

POWDER FOR USE IN DRY SENSITIZATION FOR ELECTROLESS PLATING

The present invention relates to a powder for use in dry sensitization for electroless plating comprising a plastics material with incorporated sensitized particles, and to a method for the preparation of such a powder.

Various uses of powders in connection with plating have been described previously. U.S. Pat. No. 3,910,351 describes a process for the masking of a copper surface which is to be partially etched, by sprinkling with a powder which is melted in order to obtain a continuous layer. Danish patent application No. 1507/79 (published as International Publication Number WO 80/02222) discloses the use of a plastics powder incorporating $Sn^{+2}$ compounds for a dry sensitization of an insulating substrate, which substrate may be a plastic.

It is desired to obtain a better control of line definition (resolution) and adherence of a metal layer formed by electroless metal deposition than has hitherto been possible using known techniques.

The present invention provides a powder for use in dry sensitization for electroless plating, comprising a plastics base material which is a mixture of hydrophobic and hydrophilic plastics materials to which has been added sensitizing particles.

Useful sensitizing compounds are $FeCl_2$ and $Fe(NO_3)_2$, but it is preferred to use a tin compound, more preferably $SnCl_2$, $2H_2O$, as the sensitizing compound.

Typical suitable plastics base materials are polystyrene resin, acrylic resin, polyethylene resin, polyvinyl chloride resin, polyacrylamide resin and methacrylate resin, all of which have different degrees of hydrophilia and hydrophobia in dependence on the surface of the substrate on which they are to be used. The resins may be homopolymers or copolymers of one or more monomers. There exist a number of plastics materials which are used in the manufacture of toners for electrophotography, such as Stabilit Ester 10, Pentalyn G, or piccotoner 1200 (all manufactured by Hercules, Inc.) which are all examples of hydrophobic plastics materials. Melamine-formaldehyde, polybutadiene, polymethacrylate, and polyvinyl chloride are all examples of hydrophilic plastics materials as compared to the hydrophobic materials listed above.

A particular problem is solved in connection with plating of a polycarbonate substrate by using a styrene acrylate copolymer as the hydrophobic plastic and a polyhydroxymethacrylate as the hydrophilic plastic.

The invention in another aspect provides a method of preparing a powder according to the invention, comprising mixing hydrophobic and hydrophilic plastics materials and adding sensitizing particles thereto.

In a preferred method of preparing the powder according to the invention, finely ground hydrophobic and hydrophilic plastics materials are suspended and mixed with an aqueous medium, this mixture subsequently being sensitized through addition of a tin compound and spray dried to obtain a uniform grain size and a uniform distribution of the sensitizing particles.

The grinding may be either wet or dry in order to obtain a particle size of a few micrometers. The spray drying is preferably performed with an input temperature in the range of 130 degrees centigrade to 170 degrees centigrade and an output temperature in the range of 65 degrees centigrade to 90 degrees centigrade.

In a further preferred method of preparing the powder according to the invention, finely ground hydrophobic plastics material is mixed with finely ground hydrophilic plastics material, the mixture is suspended in water, and there is added thereto a solution of the sensitizing compound, the pH value being adjusted to stimulate sensitization at the subsequent spray drying.

The invention will be further described with reference to the following illustrative examples.

EXAMPLE 1

A powder according to the invention comprised:

| | |
|---|---|
| Piccotoner 1200 (trade name Hercules, Inc.) | 200 g |
| Polyvinyl chloride | 100 g |
| $SnCl_2$, $2H_2O$ | 15 g |

EXAMPLE 2

A powder according to the invention comprised:

| | |
|---|---|
| Org-D-21 (Hercules, Inc.) | 150 g |
| Polymer of butyl ester of alpha-hydroxy-methacrylic acid | 150 g |
| $SnCl_2$, $2H_2O$ | 15 g |

EXAMPLE 3

A powder according to the invention was prepared as follows:

Piccotoner 1200 (trade name Hercules, Inc.) was wet ground to a mean particle size of 2 micrometers, and there was added thereto 20% w/w of equally fine ground polyvinyl chloride. The mixture was brought into an aqueous suspension, and 5% w/w $SnCl_2$, $2H_2O$ in aqueous solution was added. The suspension was made slightly alkaline by adding a 3% solution of $NH_4OH$. As a result seeds of hydrolyzed Sn compounds were precipitated onto each individual plastics particle. The solution was spray dried at an input temperature of 150 degrees centigrade and an output temperature of 75 degrees centigrade; a Niro Atomizer "Minor" spray drying system was used. in the manner described there was obtained a sensitized powder which upon melting will display hydrophilic and hydrophobic areas.

Practical tests on the powder according to the invention have shown the following advantages when using the powder as compared to conventional sensitization or the use of known powders.

The tin seeds have been found to adhere better to the individual plastics particles than is the case with powder where the tin compound is added by means of another process or which consists of one plastics material only, irrespective of this being either hydrophilic or hydrophobic.

A conventional hydrophobic powder which is difficult to suspend in an aqueous medium exhibits a very low adherence of the tin seeds onto the individual powder particles. This is demonstrated by the consequence of wiping off spilled or incorrectly distributed powder. In the case of a conventional powder such a wiping-off entails the deposition of minute amounts of hydrolized tin compound outside the desired areas, which in turn means that the subsequent electroless metal deposition by a wet process will also deposit metal outside the desired areas. In the case of a very hydrophilic powder it is not possible to obtain continuous plating with good adhesion, since the hydrophilia of the powder makes the substrate surface soluble in the aqueous medium which constitutes the metal deposition solution. Use of the powder according to the invention overcomes these problems in that these effects do not result.

The quality of metallization or electroless plating is dependent upon the surface tensions between the substrate and the individual components in the plastics material in the sensitizing powder. The following parameters may be defined which have all to be considered in order to obtain a metallization which is appropriate for a given substrate surface: spreading and metallizing density (determined by the combination of hydrophobia and hydrophilia), adherence (determined by the susceptibility of the melted powder to the diffusion of $H_2O$) and temperature stability (determined by the melting point of the plastics material of the powder).

It is clear that to a person skilled in the art it is a simple process to adjust the melting properties of the plastics powder according to the surface of the substrate, having regard to all the parameters mentioned.

In this specification the named products of Hercules, Inc. are identified as follows:

Stabilit Ester 10—a stabilized ester of hydrogenated rosin;

Pentalyn G—a penta-esterified maleic resin;

Piccotoner 1200—styrene/acrylic copolymer resin;

Org-D-21—styrene/acrylic copolymer resin.

What is claimed is:

1. A powder for use in dry sensitization for electroless plating, comprising a plastics base material comprising a mixture of (a) a plastics material selected from the group consisting of:
    ester of hydrogenated rosin,
    esterified maleic resin, and
    styrene-acrylic copolymer,
and (b) a plastics material selected from the group consisting of:
    polybutadiene,
    polymethacrylate,
    polyvinyl chloride, and
    polyhydroxymethacrylate,
to which has been added sensitizing particles comprising iron or tin compounds in an amount effective to achieve said sensitization.

2. The powder of claim 1 wherein the plastics base material comprises a mixture of styrene-acrylic copolymer and polyvinyl chloride.

3. The powder of claim 1 wherein the plastics base material comprises a mixture of styrene-acrylic copolymer and polyhydroxymethacrylate.

* * * * *